(12) United States Patent
Czechanowski

(10) Patent No.: US 6,301,323 B1
(45) Date of Patent: Oct. 9, 2001

(54) CIRCUIT CONFIGURATION FORMING PART OF A SHIFT REGISTER

(75) Inventor: Andreas Czechanowski, Böblingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/331,236

(22) PCT Filed: Nov. 23, 1998

(86) PCT No.: PCT/DE98/03440

§ 371 Date: Nov. 12, 1999

§ 102(e) Date: Nov. 12, 1999

(87) PCT Pub. No.: WO99/31671

PCT Pub. Date: Jun. 24, 1999

(30) Foreign Application Priority Data

Dec. 17, 1997 (DE) .............................................. 197 56 039

(51) Int. Cl.[7] .................................................. G11C 19/00
(52) U.S. Cl. ................................................. 377/54; 377/79
(58) Field of Search ........................................ 377/54, 79

(56) References Cited

U.S. PATENT DOCUMENTS 5,517,543 * 5/1996 Schleupen et al. .................... 377/79
5,631,940    5/1997 Fujikura ................................ 377/76

FOREIGN PATENT DOCUMENTS 0 615 250   9/1994 (EP) .

OTHER PUBLICATIONS

Edwards, M.J., "NMOS and CMOS Polysilicon Drive Circuits For Liquid Crystal Displays", IEEE Proceedings: Circuits Devices and Systems, vol. 141, No. 1, pp. 50–55 (Feb. 1, 1994).*

* cited by examiner

*Primary Examiner*—Margaret R. Wambach
(74) *Attorney, Agent, or Firm*—Kenyon & Kenyon

(57) ABSTRACT

A circuit arrangement as part of a shift register is proposed for controlling switch elements arranged in the form of a chain or a matrix, including four clock signals that are phase shifted by 90° with respect to one another for the control, with at least one transistor switching through a signal that is independent of the shift clock signals to the output to control the switch elements depending on the information to be shifted.

12 Claims, 2 Drawing Sheets

CIRCUIT CONFIGURATION FORMING PART OF A SHIFT REGISTER

FIELD OF THE INVENTION

The present invention relates to a circuit arrangement as part of a shift register to control switch elements arranged in the form of a chain or a matrix.

BACKGROUND INFORMATION

Switch elements arranged in the form of a chain or a matrix are controlled, in particular, by addressing row or column circuits of a liquid crystal screen. Liquid crystal screens have a matrix-shaped arrangement of pixels with a switch element being assigned to each pixel. The switch elements are often thin-layer transistors. The image information is applied to the columns and is written row by row into the pixel memory (pixels) via the switch elements. To select the rows, shift registers preferably manufactured using the same technology as the pixels are regularly used.

German Patent No. 43 07 177 describes a circuit arrangement as part of a shift register for controlling switch elements arranged in the form of a chain or a matrix. In particular, this circuit is used to control switch elements in rows of an active matrix for a liquid crystal screen. According to the present invention, the circuit should have no more than seven transistors operating as switches and no more than two capacitors, with some capacitors, together with one capacitor operating as a bootstrap capacitor forming an output stage and at least one additional transistor forming the charge and discharge stage for the bootstrap capacitor. In addition, the circuit is controlled by four clock signals, which are phase shifted 90° one in relation to the other, so that no cross currents appear in the circuit. The output signal going to the row circuit depends directly on the shape of the shift register clock signal in this circuit. In this way, the circuit has few transistors, yet the shape of the output signal is determined.

SUMMARY OF THE INVENTION

An object of the present invention is to provide a circuit arrangement as part of a shift register with which switch elements arranged in the form of a chain or a matrix can be controlled more effectively or more variably, yet with a relatively reduced number of transistors being required.

The present invention is based on a circuit arrangement as part of a shift register to control switch elements arranged in a chain or matrix form. To control the circuit arrangement, four clock signals, phase shifted 90° in relation to one another, are available. The fact that in addressing rows or columns of a matrix no arbitrary pulse sequences are required as shift information is taken into account here. Instead, it is sufficient to shift an input pulse through all stages of the shift register prior to applying the next input pulse to the input of the first stage. The present invention contemplates that in the circuit arrangement as part of a shift register at least one transistor switches through a signal that is independent of the shift clock signals to the output, depending on the information to be shifted, in order to control the switch elements. This feature has the advantage that the signal form that has been switched through can be adjusted to the needs of the output. Thus, for example, when controlling the rows of an active matrix for liquid crystal screens, the selection voltage curve can be individually adjusted to the characteristics of the thin layer transistors arranged in the rows, thereby achieving the desired charge characteristics of the pixels affected.

In order to prevent the transistors controlled by the different shift clock signals from becoming conductive simultaneously, allowing cross currents to flow, it is proposed that the clock signals, phase shifted by 90° with respect to one another, be substantially non-overlapping.

In order to avoid undesirable output signals, it is furthermore proposed that two selection signals (111, 112) be provided, which are alternatingly connected to adjacent circuit arrangements of the shift register and have non-overlapping signal forms that are phase shifted 180° with respect to one another.

It is furthermore advantageous if the circuit arrangement has no more than eight effective transistors, which operate as switches. Thus the circuit is substantially independent of the characteristics of the transistors in the amplifier range, since the operating point of the transistors when switched on is always in the starting range. Due to the reduced number of transistors (no more than eight), a high degree of efficiency is achieved in manufacturing such circuits with a relatively compact design.

In a particularly advantageous embodiment of the circuit arrangement according to the present invention, the circuit includes two clocked inverters connected in series with an output stage connected between them. The inverter stages preferably each have three transistors connected in series. This arrangement has the advantage that the circuit can be implemented with only three crossovers not considering the relatively problem-free crossovers of supply lines. The output stage is preferably formed by at least two transistors with at least one bootstrap capacitor. Using a first transistor with a bootstrap capacitor, the selection signal can be switched through to the output with a relatively low resistance. With the second transistor of the output stage, which preferably also has a capacitor at the control electrode, the information to be shifted can be completely isolated from the output side. Even if the output were to be short-circuited, the information to be shifted in the shift register would not be affected. These features result in improved resistance of the circuit arrangement to interference.

In order to achieve manufacturing technology compatibility with the control matrices of an active liquid crystal display, it is proposed that the circuit be manufactured using thin film technology. The circuit arrangement is particularly well-suited for manufacture using amorphous silicon technology, polysilicon technology or polycadmium technology. It is advantageous if the transistors are field-effect transistors of the n-MOS enhancement type. They can be manufactured in a particularly advantageous manner and, when large-surface thin film technology is used, result in a simple manufacturing process with high manufacturing yields.

A particular advantage is obtained when the circuit arrangement is used for controlling row and/or column circuits of liquid crystal screens.

DETAILED DESCRIPTION

Figure 1:
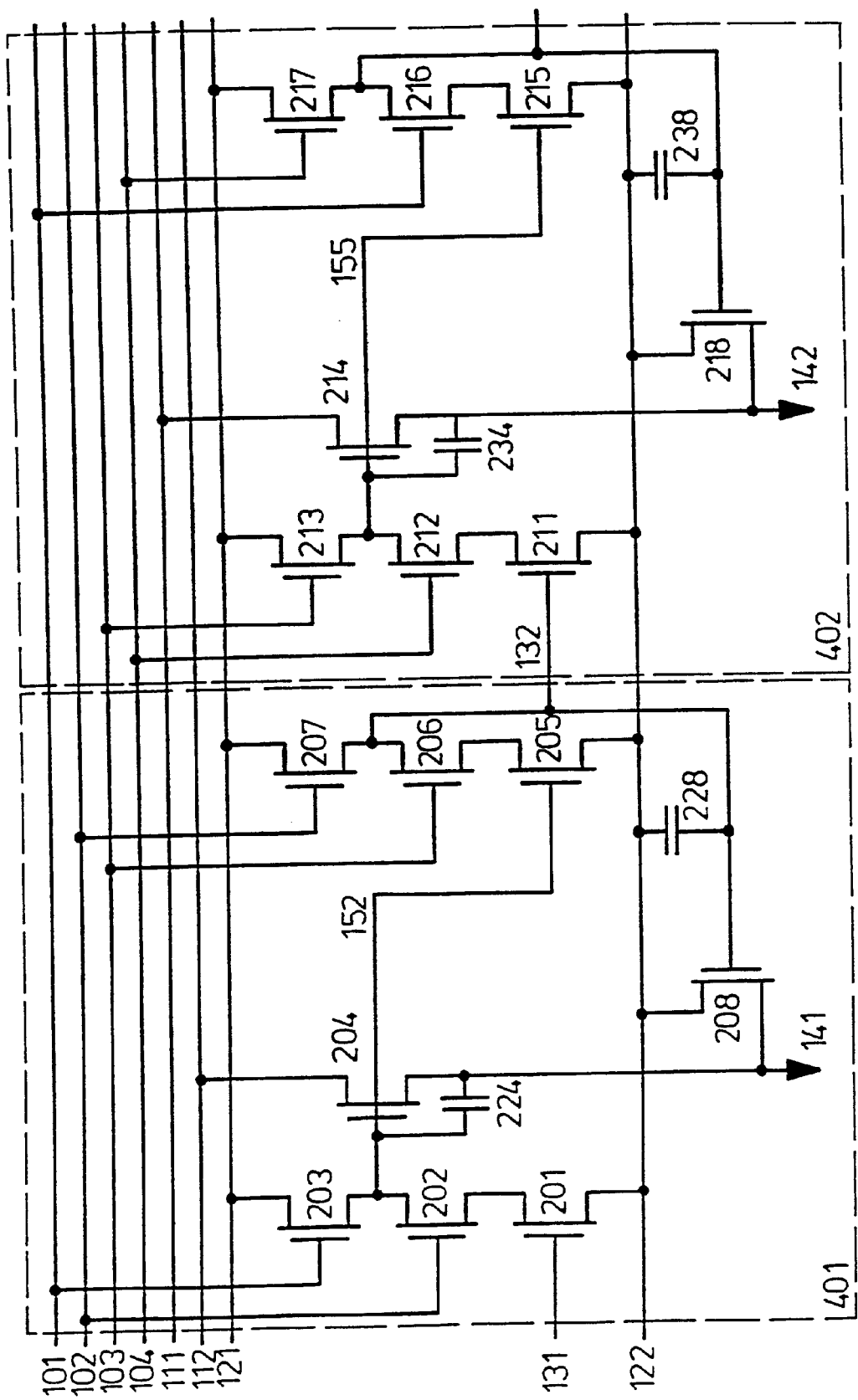
FIG. 1 shows a circuit arrangement according to the present invention for the nth stage and (n+1)th stage of a dynamic shift register for row control.

FIG. 1 shows an embodiment of a circuit arrangement according to the present invention as the nth and (n+1)th stage of a dynamic shift register. The shift register is controlled by the four shift clock signals 101 through 104. As shown in the signal diagram of FIG. 2, shift clock signals 101 through 104 each have a phase shift of 90° with respect to one another with the individual pulses not overlapping. Each stage is also supplied with an operating voltage 121, which is greater than zero. Furthermore, shift register stages 401 and 402 are alternatingly connected to two selection signals 111 and 112, respectively. Shift register stages 401 and 402 differ only in the supply of shift clock signals 101 through 104 and of the aforementioned selection signals 111 and 112.

Shift register stage 401 has thin film transistors 201 through 208 and capacitors 224 and 228. In principle, each shift register stage 401 can be divided into two clocked inverters connected in series with an output stage connected between them. Each of the inverters includes three transistors 201 through 203 and 205 through 207 connected in series. The output stages connected between the transistors are formed by the two transistors 208 and 204. In addition to the aforementioned signals, each stage is connected to ground potential 122, which represents, at the same time, the reference potential for the voltage information in the diagram of FIG. 2. Signals 131 and 132 are supplied to the respective shift register stages as shift information. Signal 132 is also the output signal of stage 401 and the input signal of stage 402. Signal 141 is the output of stage 401 to the corresponding row circuit of an active matrix liquid crystal screen (not shown), for example.

The thin film transistors are all field-effect transistors of, for example, the n-MOS enhancement type, which become conductive when a positive voltage is applied between the control electrode and the channel and non-conductive when a negative voltage or no voltage is applied between the control electrode and the channel.

Figure 2:
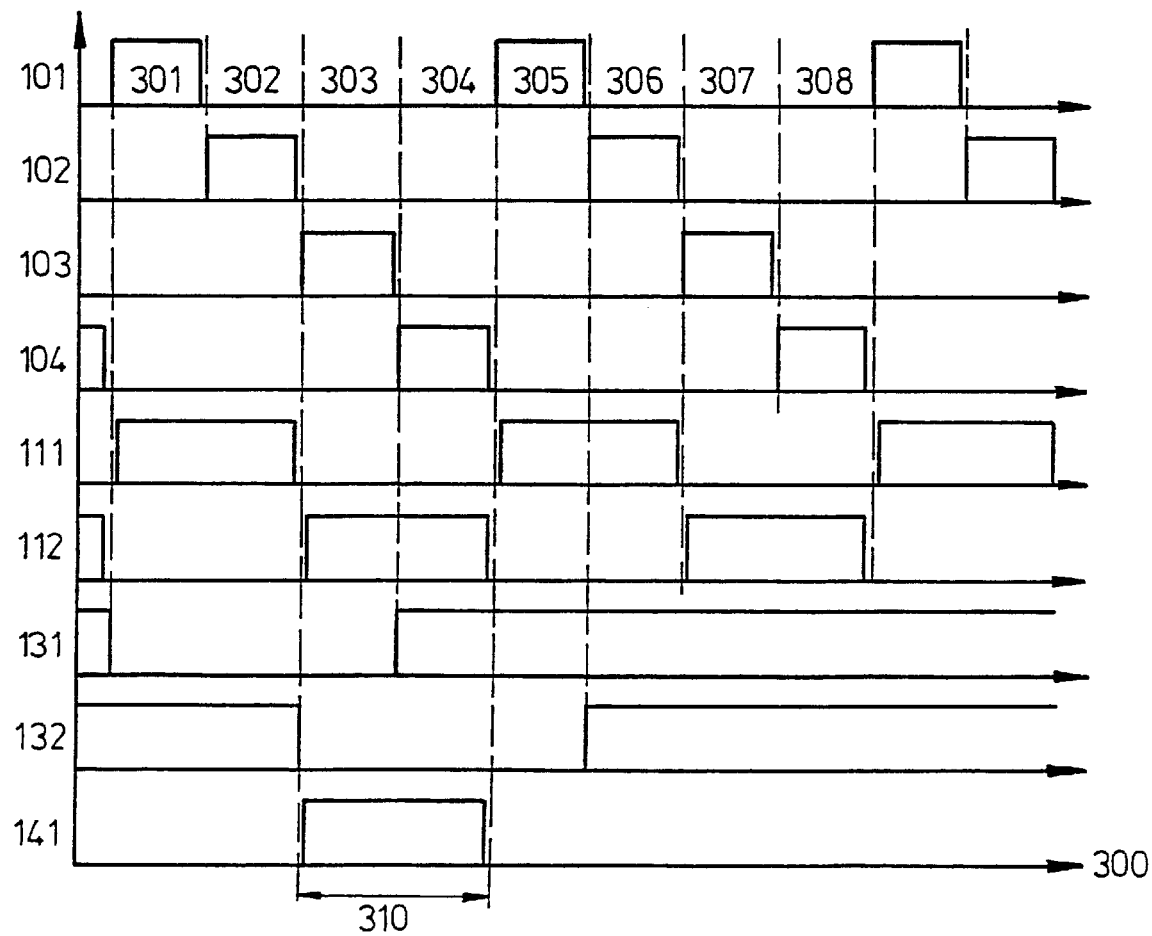
FIG. 2 shows the variation over time of different signals for the circuit arrangement according to FIG. 1.

FIG. 2 shows the sequence over time of the individual signals. Signals 101 through 104 are, as mentioned previously, non-overlapping shift clock signals, which control the information transport in the shift register. Selection signals 111 and 112 determine the output pulse form for the row circuit to be controlled. FIG. 2 shows the different signal states in a time sequence with reference to each other and to time interval 301 through 308. For example, in each state 301 through 308, one of signals 101 through 104 is positive with respect to ground potential 122, while the other three signals are at ground potential.

In state 301, transistor 203 becomes conductive due to a positive pulse in signal 101 and thus capacitor 224 is charged. Due to the voltage applied between control electrode and the channel of transistor 204, the latter becomes conductive. The same is true for transistor 205, which is switched through by conductive transistor 204. In clock state 302, transistor 202 becomes conductive. Since signal 131 is conducting ground potential at this time, transistor 201 blocks, so that capacitor 224 cannot discharge via transistors 201 and 202 connected in series. At the same time, transistor 207 becomes conductive and charges capacitor 228. Transistor 208 becomes thereby conductive. Thus output 141 is no longer grounded via transistor 204, but via transistor 208.

In state 303, transistor 206 becomes conductive due to the positive voltage of 103. As a result, capacitor 228 is discharged again via transistor 205, which is still conductive, and 206, and transistor 208 becomes thereby non-conductive. At the same time, selection signal 112 becomes positive and is applied to the output for the row circuit as output signal 141 via transistor 204, which is still conductive. The positive voltage of the control electrode of transistor 204 is increased by the value of selection signal amplitude 112 due to the bootstrap effect via capacitor 224, which ensures that selection signal 112 is sent to the row circuit with a particularly low resistance. During clock state 304, information voltage 131 becomes positive, making transistor 201 conductive. No more changes take place. At the end of this state, signal 112 is set to ground potential again, whereby output signal for row circuit 141 assumes ground potential via transistor 204, which is still conductive, and the row circuit is discharged.

In clock state 305, the same thing occurs as previously in clock state 301, but with the difference that transistor 201 becomes conductive due to the high potential of 131. In state 306, transistor 202 also becomes conductive, so that capacitor 224 is discharged via the two transistors 201 and 202. Transistors 204 and 205 thereby become non-conductive, while transistor 207 becomes conductive and recharges capacitor 228, whereby transistor 208 becomes conductive again.

With this procedure, the output signal to the row circuit is set to ground potential whereby any charges on a row circuit can be removed.

In state 307, transistor 206 becomes conductive. Since transistor 205 is non-conductive, capacitor 228 remains charged. At the same time, selection voltage 112 becomes positive. Since transistor 204 is non-conductive, the output signal to row circuit 141 also remains unaffected. In addition, transistor 208 is conductive, whereby output signal 141 is set to ground potential.

For clock state 308 no change occurs with respect to the previous state within stage 401.

In shift register stage 402, all the above-described sequences run delayed by two clock states compared to stage 401. In clock state 303, the same thing applies here as for stage 401 in clock state 301.

Period 310 shown in FIG. 1 on time axis 300 corresponds to the time during which the row is selected on the basis of a positive output signal.

The circuit described is particularly well suited for amorphous or polycrystalline semiconductor materials such as amorphous or polycrystalline silicon or polycrystalline cadmium selenide using thin film technology.

What is claimed is:

1. A circuit arrangement as part of a shift register for controlling switch elements arranged in a form of at least one of a chain and a matrix, comprising:
   at least one transistor for switching through, in a direct current path, a selection signal to an output for controlling the switch elements, the switching being dependent upon information being shifted by the shift register, the selection signal being independent of four clock signals for controlling the circuit arrangement, each clock signal of the four clock signals being phase shifted by 90 degrees with respect to one another.

2. The circuit arrangement according to claim 1, further comprising:
   a plurality of transistors for operating as switches, the plurality of transistors not exceeding eight transistors.

3. The circuit arrangement according to claim 2, wherein the plurality of transistors are field-effect transistors of an n-MOS enhancement type.

4. The circuit arrangement according to claim 2, wherein the circuit arrangement is used for controlling at least one of rows and columns of liquid crystal screens.

5. The circuit arrangement according to claim 1, further comprising:

two inverter stages coupled in series with an output stage connected therebetween, the output stage including the at least one transistor for switching through the selection signal.

6. The circuit arrangement according to claim 5, wherein the output stage includes at least two transistors and at least one bootstrap capacitor.

7. The circuit arrangement according to claim 1, wherein the circuit arrangement is manufactured using thin-film technology.

8. The circuit arrangement according to claim 1, wherein the at least one transistor is a field-effect transistor of an n-MOS enhancement type.

9. A circuit arrangement, as part of a shift register for controlling switch elements arranged in a form of at least one of a chain and a matrix, comprising:

at least one transistor for switching through a selection signal to an output for controlling the switch elements, the switching being dependent upon information being shifted by the shift register, the selection signal being independent of four clock signals for controlling the circuit arrangement, each clock signal of the four clock signals being phase shifted by 90 degrees with respect to one another; and two inverter stages coupled in series with an output stage connected therebetween, the output stage including the at least one transistor for switching through the selection signal;

wherein each of the two inverter stages includes three transistors coupled in series.

10. A circuit arrangement, as part of a shift register for controlling switch elements arranged in a form of at least one of a chain and a matrix, comprising:

at least one transistor for switching through a selection signal to an output for controlling the switch elements, the switching being dependent upon information being shifted by the shift register, the selection signal being independent of four clock signals for controlling the circuit arrangement, each clock signal of the four clock signals being phase shifted by 90 degrees with respect to one another;

wherein each clock signal does not substantially overlap with respect to one another.

11. A circuit arrangement, as part of a shift register for controlling switch elements arranged in a form of at least one of a chain and a matrix, comprising:

at least one transistor for switching through a selection signal to an output for controlling the switch elements, the switching being dependent upon information being shifted by the shift register, the selection signal being independent of four clock signals for controlling the circuit arrangement, each clock signal of the four clock signals being phase shifted by 90 degrees with respect to one another;

wherein the selection signal is phase shifted by 180 degrees with respect to a second selection signal, the selection signal and the second selection signal not overlapping.

12. A circuit arrangement, as part of a shift register for controlling switch elements arranged in a form of at least one of a chain and a matrix, comprising:

at least one transistor for switching through a selection signal to an output for controlling the switch elements, the switching being dependent upon information being shifted by the shift register, the selection signal being independent of four clock signals for controlling the circuit arrangement, each clock signal of the four clock signals being phase shifted by 90 degrees with respect to one another; and at least one second transistor for switching through a second selection signal to a second output for controlling the switch elements, the switching being dependent upon information being shifted by the shift register, the second selection signal being independent of the four clock signals for controlling the circuit arrangement.

* * * * *